(12) United States Patent
Ose

(10) Patent No.: US 6,746,941 B2
(45) Date of Patent: Jun. 8, 2004

(54) SEMICONDUCTOR WAFER AND PRODUCTION METHOD THEREFOR

(75) Inventor: Hiroki Ose, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 10/226,122

(22) Filed: Aug. 23, 2002

(65) Prior Publication Data

US 2003/0001160 A1 Jan. 2, 2003

Related U.S. Application Data

(62) Division of application No. 09/582,408, filed as application No. PCT/JP99/05969 on Oct. 28, 1999, now Pat. No. 6,454,854.

(30) Foreign Application Priority Data

Oct. 29, 1998 (JP) ............................................ 10-326033

(51) Int. Cl.[7] .......................... H01L 21/36; C30B 28/14
(52) U.S. Cl. ........................ 438/505; 438/508; 117/84; 117/86; 117/93
(58) Field of Search ................................ 117/84, 86, 90, 117/93; 438/505, 508; 428/446, 620, 64.1

(56) References Cited

U.S. PATENT DOCUMENTS

| | | |
|---|---|---|
| 5,755,878 A | 5/1998 | Habuka et al. |
| 5,951,774 A | 9/1999 | Shishiguchi et al. |
| 6,475,627 B1 * | 11/2002 | Ose ............................ 428/446 |

FOREIGN PATENT DOCUMENTS

| | | |
|---|---|---|
| EP | 0709 489 | 5/1996 |
| EP | 0784 106 | 7/1997 |
| JP | 59-36927 | 2/1984 |
| JP | 5-226263 | 9/1993 |
| JP | 8-124859 | 5/1996 |
| JP | 9-194296 | 7/1997 |

* cited by examiner

*Primary Examiner*—Minh-Loan Tran
(74) *Attorney, Agent, or Firm*—Snider & Associates; Ronald R. Snider

(57) ABSTRACT

It is an object of the invention to provide a semiconductor wafer obtained by forming a semiconductor thin film with uniform resistivity on a main surface of a semiconductor single crystal substrate of 300 mm or more in diameter.

When a process gas is supplied to over a main surface of a silicon single crystal substrate 12 in rotation in almost parallel to the main surface thereof in one direction in a reaction chamber 10 through six inlet ports 18a to 18f disposed in width direction of the reaction chamber 10, $H_2$ gas, a semiconductor raw material gas and a dopant gas are supplied onto an area in the vicinity of the center of the main surface of the silicon single crystal substrate 12 and an intermediate area thereof through the inner inlet ports 18a and 18b and the middle inlet ports 18c and 18d, and only $H_2$ gas and the semiconductor raw material gas without the dopant gas are supplied onto an area in the vicinity of the outer periphery thereof from the outer inlet ports 18e and 18f. In such arrangement, a dopant gas produced by the auto-doping phenomenon is supplied onto the area in the vicinity of the outer periphery of the main surface of the silicon single crystal substrate 12. For this reason, the dopant gases from both sources are combined, thereby a concentration of the dopant gas supplied over all the main surface of the silicon single crystal substrate 12 is almost uniform.

5 Claims, 6 Drawing Sheets

SEMICONDUCTOR WAFER AND PRODUCTION METHOD THEREFOR

RELATED APPLICATIONS

This application claims the priority of Japanese Patent Application No. 10-326033, filed on Oct. 29, 1998, and PCT/JP99/05969 filed Oct. 28, 1999 which are incorporated herein by reference. This application is a divisional of application Ser. No. 09/582,408, filed on Jun. 26, 2000 (now U.S. Pat. No. 6,454,854 issued Sep. 24, 2002.

TECHNICAL FIELD

This invention relates to a semiconductor wafer and a production method therefor and particularly, a semiconductor wafer obtained by forming a semiconductor thin film having a uniform resistivity distribution on a main surface of a large diameter semiconductor substrate and a production method therefor.

BACKGROUND ART

In company with recent miniaturization of an electronic device, not only has the use of semiconductor wafers each obtained by forming a silicon single crystal thin film on a main surface of a silicon single crystal substrate increased, but a more uniform resistivity distribution of the silicon single crystal thin film has also been required. The term uniform resistivity distributions used here, to be detailed, means that a resistivity distribution across the surface of the silicon single crystal thin film is uniform. Further, a larger diameter has also been demanded on a semiconductor wafer together with the uniform resistivity distribution. A horizontal, single wafer vapor phase growth apparatus has been mainly employed as an apparatus for growing a silicon single crystal thin film on a main surface of a silicon single crystal substrate keeping pace with use of a large diameter semiconductor wafer.

Description will be below given of a horizontal, single wafer vapor phase growth apparatus generally employed with reference to FIGS. 5 and 6, wherein FIG. 5 is a sectional view in a horizontal plane showing a conventional horizontal, single wafer vapor phase growth apparatus in a simplified manner and FIG. 6 is a vertical sectional view showing the apparatus in a simplified manner. As shown in FIGS. 5 and 6, in a conventional horizontal, single wafer vapor phase growth apparatus, a susceptor 14 on which a silicon single crystal substrate 12 is horizontally placed is disposed at the bottom of the middle portion of a transparent quartz glass reaction chamber 10 installed along a horizontal direction and the susceptor 14 is coupled with a rotation unit (not shown) through a rotary shaft 16.

Further, a gas inlet port 18 is provided atone end in a length direction of the reaction chamber 10 and a gas outlet port 20 is provided at the other end thereof. With this construction, a flow of a gas which is introduced through the gas inlet port 18 into the reaction chamber 10 and discharged through the gas outlet port 20 to the outside passes over a main surface of the silicon single crystal substrate 12 placed on the susceptor 14 almost along a length direction of the reaction chamber 10. Further, the gas inlet port 18 of the reaction chamber 10 is constructed of six inlet ports 18a to 18f spread in a width direction of the reaction chamber 10. Among the six inlet ports 18a to 18f, a pair of two inlet ports at the innermost side (hereinafter simply referred to as inner inlet ports) 18a and 18b are arranged in symmetry with respect to an imaginary central axis along a length direction of the reaction chamber 10, passing through the center of the main surface of the silicon single crystal substrate 12 on the susceptor 14, and this arrangement of the inner inlet ports 18a and 18b applies to not only a pair of two inlet ports at the outermost side (hereinafter simply referred to as outer inlet ports) 18e and 18f, but also a pair of two inlet ports each between one of the two inner inlet ports and the corresponding one of the two outer inlet ports (hereinafter simply referred to as middle inlet ports) in the same way.

To be more detailed, the inner inlet ports 18a and 18b are directed toward points in the vicinity of the center of the main surface of the silicon single crystal substrate 12 on an imaginary central axis along a width direction of the reaction chamber 10, passing through the center of the main surface of the silicon single crystal substrate 12 on the susceptor 14, and the outer inlet ports 18e and 18f are directed toward points in the vicinity of the outer periphery of the main surface of the silicon single crystal substrate 12 on the imaginary central axis line and the middle inlet ports 18c and 18d are directed toward points between the central portion and the outer peripheral portion of the main surface of the silicon single crystal substrate 12 on the imaginary central axis line.

Further, the six inlet ports 18a to 18f are all connected to a common gas pipe 22. The common gas pipe 22 are branched in three ways and the branches are connected to a gas source (not shown) of hydrogen ($H_2$) gas as a carrier gas, a gas source (not shown) of a semiconductor raw material gas and a gas source (not shown) of a dopant gas through mass flow controllers MFC 24, 26 and 28, respectively, as gas flow rate regulators.

Further, outside of the reaction chamber 10, an infrared radiation lamp 30, for example, as a heat source heating the silicon single crystal substrate 12 placed on the susceptor 14 is disposed and by supplying a power to the infrared radiation lamp 30, the main surface of the silicon single crystal substrate 12 is heated to a predetermined temperature. In addition, cooling means (not shown) for cooling the infrared radiation lamp 30 and an outer wall of the reaction chamber 10 is equipped.

Then, description will be made of a method for forming a silicon single crystal thin film on the main surface of the silicon single crystal substrate 12 using the conventional horizontal, single wafer vapor growth apparatus shown in FIGS. 5 and 6.

First, the silicon single crystal substrate 12 is horizontally placed on the susceptor 14 of the reaction chamber 10. Following this, $H_2$ gas is supplied into the reaction chamber 10 from the gas source of $H_2$ gas through MFC 24, the common gas pipe 22 and through the six inlet ports 18a to 18f to replace the atmosphere in the reaction chamber 10 with hydrogen. Further, with the rotation device, the susceptor 14 is rotated through the rotary shaft 16 clockwise as shown by arrow marks of FIGS. 5 and 6 while the silicon single crystal substrate 12 is horizontally placed on the susceptor 14. Then, with the infrared radiation lamp 30, the silicon single crystal substrate 12 on the susceptor 14 is heated to raise a temperature of the main surface thereof to a predetermined one.

After doing so, the semiconductor raw material gas and the dopant gas are supplied into the reaction chamber 10 from the respective gas sources of the semiconductor raw material gas and the dopant gas through MFC 26 and 28, the common gas pipe 22 and the six inlet ports 18a to 18f.

At this time, not only are flow rates of $H_2$ gas as a carrier gas, the semiconductor raw material gas and the dopant gas controlled individually and precisely by MFC 24, 26 and 28, respectively, but the gases are mixed after the individual control and introduced into the reaction chamber 10 as a process gas having the raw material gas and the dopant gas of respective constant concentrations with almost no diffusion in a width direction through the six inlet ports 18a to 18f disposed in a width direction of the reaction chamber 10.

The process gas introduced into the reaction chamber 10 passes over the main surface of the silicon single crystal substrate 12 placed horizontally on the susceptor 14 rotating about the rotary shaft 16 as a center in one direction and in almost parallel to the main surface. During the passage over the main surface, a chemical reaction arises to grow the silicon single crystal thin film 32 in vapor phase on the main surface of the silicon single crystal substrate 12.

In a case where a silicon single crystal thin film 32 was formed on the main surface of the silicon single crystal substrate 12 using the conventional horizontal, single wafer vapor phase growth apparatus shown in FIGS. 5 and 6 as described above, and when the diameter of a silicon single crystal substrate 12 was 200 mm or less, a resistivity distribution along a diameter of the silicon single crystal thin film 32 formed on the main surface of the silicon single crystal substrate 12 was almost uniform. However, when a diameter of the silicon single crystal substrate 12 was larger than 200 mm, for example the diameter of as large as 300 mm, a conspicuous non-uniformity occurred in a resistivity distribution along a diameter direction of the silicon single crystal thin film 32. That is, a resistivity in the vicinity of the outer periphery of the silicon single crystal thin film 32 of a diameter of 300 mm was sharply reduced compared with the central portion other than an area in the vicinity of the outer periphery.

The sharp reduction in resistivity in the vicinity of the outer periphery of the silicon single crystal thin film 32 is estimated to be caused by the so-called auto-doping phenomenon. Here, the auto-doping phenomenon will be explained below:

When the silicon single crystal thin film 32 is grown in vapor phase on the main surface of the silicon single crystal substrate 12, an impurity added originally in the silicon single crystal substrate 12 is released into the reaction atmosphere through etching by $H_2$ gas in the reaction atmosphere, occurring on a rear main surface of the silicon single crystal substrate 12 heated at a high temperature and works as a dopant gas. The dopant gas generated from the rear main surface of the silicon single crystal substrate 12 is migrated along the side surface of the silicon single crystal substrate, further comes onto the front main surface to be incorporated into the silicon single crystal thin film 32 during vapor phase growth. In such a way, since the dopant gas produced on the rear main surface of the silicon single crystal substrate 12 is supplied into the silicon single crystal thin film 32 in addition to a dopant gas introduced intentionally from a gas inlet port 18, an impurity more than necessary is added and thereby a resistivity of the silicon single crystal thin film 32 is forcibly reduced lower than a target value. Since a concentration of the dopant gas, around the silicon single crystal substrate, produced on the rear main surface, migrated along the side surface and coming onto the front main surface is highest at the outer peripheral portion and reduced toward the central portion, a sharp reduction in resistivity occurs in the vicinity of the outer periphery of the silicon single crystal thin film 32.

Such an auto doping phenomenon occurs theoretically independent of a size of the silicon single crystal substrate 12. Actually, however, in a conventional case where a diameter of a silicon single crystal substrate 12 was less than 200 mm, reduction in resistivity in the vicinity of the outer periphery of a silicon single crystal thin film 32, caused by the auto-doping phenomenon was not conspicuous, so that a resistivity distribution across the silicon single crystal thin film 32 fell within an allowable range.

When this inventor used a silicon single crystal substrate 12 of 300 mm in diameter and a low resistivity to carry out vapor phase growth on a main surface thereof in order to respond to a recent demand for a semiconductor wafer of a large diameter, the inventor experienced a sharp reduction in resistivity in the vicinity of the outer periphery of the silicon single crystal thin film 32 due to the auto-doping phenomenon, with the result that a problem became obvious since there arose a conspicuous non-uniformity in a resistivity distribution along a diameter thereof.

It should be noted that it has been known, as means suppressing occurrence of the auto-doping phenomenon, that a film made of silicon nitride or silicon oxide is formed on a rear main surface of the silicon single crystal substrate 12. In this method, however, there is a fear that a film for prevention of an auto-doping phenomenon formed on the rear main surface of the silicon single crystal substrate 12 becomes a particle generation source and/or a metal contamination source, which entails a problem of a quality of the silicon single crystal thin film 32 formed on the front main surface of the silicon single crystal substrate 12 being degraded. In this method, in addition to an extra step of forming an auto-doping preventive film on the rear main surface of the silicon single crystal substrate 12, another extra step of removing the auto-doping preventive film after forming the auto-doping preventive film becomes necessary, which produces a problem of reduction in productivity and increase in production cost combined.

DISCLOSURE OF INVENTION

The invention has been made in light of the above described problems and it is accordingly an object of the invention to provide not only a semiconductor wafer obtained by forming a semiconductor thin film having a uniform resistivity distribution on a main surface of a large diameter silicon single crystal substrate of 300 mm or more in diameter, but a production method for a semiconductor wafer by which a semiconductor thin film having a uniform resistivity distribution is formed on a front main surface of a large diameter semiconductor single crystal substrate of 300 mm or more in diameter without forming an auto-doping preventive film on the rear main surface thereof. The above described task is achieved by a semiconductor wafer and a production method therefor relating to the invention described below:

That is, a semiconductor wafer relating to the invention is characterized by that the semiconductor wafer has a construction in which a semiconductor thin film of 8% or less in resistivity distribution along a diameter is formed on a p-type semiconductor single crystal substrate of a diameter ranging from 300 mm to 400 mm, both limits being included, and a resistivity ranging from 0.01 Ω·cm to 0.02 Ω·cm, both limits being included. Here, a value representing a resistivity distribution along a diameter of a semiconductor thin film, that is, 8% or less is calculated by the following formula:

$$\text{(Maximum resistivity–Minimum resistivity)/average resistivity over all measurement points} \qquad (1)$$

In such a manner, in a semiconductor wafer relating to the invention, a semiconductor thin film of 8% or less in resistivity distribution along a diameter is formed on a main surface even of a p-type semiconductor single crystal substrate as large as from 300 mm to 400 mm, both limits being included, in diameter and as low as from 0.01 Ω·cm to 0.02 Ω·cm, both limits being included, in resistivity, and thereby a large diameter and a uniform resistivity distribution as characteristics of a recent semiconductor wafer are both achieved, which contributes largely to increase in throughput and yield of semiconductor chips in production.

It is preferable that in a semiconductor wafer relating to the invention, a resistivity distribution along a diameter of a semiconductor thin film formed on a main surface of a p-type semiconductor single crystal substrate is within ±4% or less. Here, a value representing a resistivity distribution along a diameter of a semiconductor thin film, that is, ±4% or less is calculated by the following formula:

$$(\text{Maximum resistivity} - \text{Minimum resistivity})/(\text{Maximum resistivity} + \text{Minimum resistivity}) \qquad (2)$$

In this case, uniformity in resistivity distribution required for a recent semiconductor wafer is achieved with a high accuracy, thus further contributing to increase in yield of semiconductor chips in production.

Further, in a semiconductor wafer relating to the invention, a diameter of the semiconductor single crystal substrate is preferably 300 mm. At the present stage, since a semiconductor single crystal substrate with a diameter up to 300 mm can be produced in a stable manner with high quality, it is practically enjoyed to an full extent that a resistivity distribution of a semiconductor thin film along a diameter is achieved with uniformity of 8% or less (in a case of calculation with the above described formula (1)) or within ±4% or less (in a case of calculation with the above described formula (2)) on a main surface of a semiconductor single crystal substrate as low as from 0.01 Ω·cm to 0.02 Ω·cm, both limits being included, in resistivity.

Further, it is preferable that a semiconductor single crystal substrate is a silicon single crystal substrate and a semiconductor thin film is a silicon single crystal thin film. That is, since a large diameter and a uniform resistivity distribution as characteristics of a silicon single crystal wafer,which is a main stream of currently used semiconductor wafers, are both achieved, there arises expectation of a wide application of the silicon single crystal wafer in various aspects in fabrication of semiconductor devices.

Further, in a production method for a semiconductor wafer relating to the invention, a semiconductor raw material gas is supplied through a plurality of gas inlet ports disposed in a width direction of the reaction chamber onto a main surface of a semiconductor single crystal substrate rotating in a reaction chamber in one direction in almost parallel to the main surface thereof to grow a semiconductor thin film on the main surface thereof in vapor phase and a dopant gas is supplied from gas inlet ports in the inner side among the plurality of gas inlet ports.

In such a manner, in a production method of a semiconductor wafer relating to the invention, a semiconductor raw material gas is supplied through the plurality of gas inlet ports disposed in a width direction of the reaction chamber onto a main surface of a semiconductor single crystal substrate in one direction in almost parallel to the main surface thereof and a dopant gas is supplied from gas inlet ports in the inner side among the plurality of gas inlet ports, that is, without supplying the dopant gas from gas inlet ports in the outer side among the plurality of gas inlet ports, with the result that a concentration of the dopant gas supplied into the vicinity of the outer periphery of the main surface of a semiconductor single crystal substrate is lower than that supplied into the central portion other than an area in the vicinity of the outer periphery on a relative basis. In this situation, however, a dopant gas produced on a rear main surface of the semiconductor single crystal substrate, migrating along the side surface thereof and coming onto the front main surface thereof is supplied in the vicinity of the outer periphery thereof by the auto-doping phenomenon. For this reason, a dopant gas supplied from the gas inlet ports and a dopant gas supplied by the auto-doping phenomenon are combined and thereby, a concentration of the combined dopant gas supplied onto the front main surface of the semiconductor single crystal substrate can be almost uniform across the whole of the front main surface. As a result, a resistivity distribution along a diameter of the semiconductor thin film grown in vapor phase on the front main surface of the semiconductor single crystal substrate can be more uniform.

Further, in a production method for a semiconductor wafer relating to the invention, the plurality of gas inlet ports are preferably composed of three kinds: an inner inlet port disposed at the innermost side in a width direction of a reaction chamber, an outer inlet port disposed at the outermost side in the width direction thereof and a middle inlet ports disposed between the inner inlet port and the outer inlet port and gas inlet ports disposed In the inner side among the plurality of gas inlet ports include the inner inlet port and the middle inlet port.

In such a manner, in a production method for a semiconductor wafer relating to the invention, the plurality of gas inlet ports include the three kinds of the inner gas inlet port, the outer gas inlet port and the middle gas inlet port and, on an imaginary central axis along a width direction of the reaction chamber, passing through the center of the main surface of the semiconductor single crystal substrate, a semiconductor raw material gas is supplied onto an area in the vicinity of the center of the main surface of the semiconductor single crystal substrate from the inner gas inlet port, onto an area in the vicinity of the outer periphery thereof from the outer gas inlet port and onto an intermediate area between the area in the vicinity of the center and the area in the vicinity of the outer periphery from the middle gas inlet port, while a dopant gas is not supplied from the outer gas inlet port but from the inner and middle gas inlet ports. In this situation, since while a concentration of a dopant gas supplied in the vicinity of the outer periphery of the main surface of the semiconductor single crystal substrate is lower than those of the dopant gas supplied to the area in the vicinity of the central portion and the intermediate area on a relative basis, an additional dopant gas produced by the auto-doping phenomenon is supplied to the area in the vicinity of the outer periphery, therefore a concentration of the combined dopant gas supplied to across all the main surface of the semiconductor substrate is almost uniform. Accordingly, a resistivity distribution along a diameter of the semiconductor thin film grown in vapor phase on the main surface of the semiconductor single crystal substrate becomes more uniform with no need to provide an extra step of forming an auto-doping protective film on the rear main surface thereof.

It should be noted that while description is made of the case where among the plurality of gas inlet ports disposed in a width direction of a reaction chamber, two kinds of inner and middle gas inlet ports are provided as gas inlet ports disposed in the inner side of the plurality of gas inlet ports for supply of a dopant gas, three or more kinds of gas inlet ports can also be provided as the gas inlet ports disposed in the inner side thereof for supply of a dopant gas according to a size of a semiconductor single crystal substrate.

Further, in a production method for a semiconductor wafer relating to the invention, it is further preferable that dopant gas rates supplied from the inner and middle inlet ports are individually controlled.

In such a manner, since in a production method for a semiconductor wafer, dopant gas rates supplied onto the area in the vicinity of the center and the intermediate area of a main surface of a semiconductor single crystal substrate other than the area in the vicinity of the outer periphery thereof are individually controlled on an imaginary central axis along a width direction of the reaction chamber, passing through the center of the main surface of the semiconductor single crystal substrate, therefore concentrations of a dopant gas supplied onto the area in the vicinity of the center and the intermediate area can be closer in magnitude to each other, resulting in more uniform resistivity distribution along a diameter of a semiconductor thin film grown in vapor phase on the main surface of a semiconductor single crystal substrate.

It should be noted that in a production method for a semiconductor wafer relating to the invention, it is preferable that as a semiconductor single crystal substrate, there is used a p-type semiconductor single crystal substrate of a diameter ranging from 300 mm to 400 mm, both limits being included, and especially a diameter of 300 mm and of a resistivity ranging from 0.01 Ω·cm to 0.02 Ω·cm, both limits being included.

That is, since in a case where a semiconductor single crystal substrate is of a diameter in the range of from 300 mm to 400 mm, both limits being included, and among them, especially, a diameter of 300 mm, a semiconductor single crystal substrate of which can be produced in a stable manner with high quality at the present stage, reduction in resistivity in the vicinity of the outer periphery of a semiconductor single crystal thin film caused by the auto-doping phenomenon becomes conspicuous, therefore stoppage of dopant gas supply onto an area in the vicinity of the outer periphery from a gas inlet port exerts practically a sufficient influence to make a resistivity distribution along a diameter of the semiconductor thin film uniform.

It should be noted that in a production method for a semiconductor wafer relating to the invention, a diameter of a semiconductor single crystal substrate is not limited to the range of from 300 mm to 400 mm, both limits being included, but a diameter beyond 400 mm thereof can be still used in the production method. In this case, as described above, a measure is conceived in which three or more kinds of gas Inlet ports are provided as gas inlet ports in the inner side for supply of a dopant gas.

Further, in a case where a semiconductor single crystal substrate of a low resistivity lower than 0.01 Ω·cm is used, since an influence of the auto-doping phenomenon increases and reduction in resistivity in the vicinity of the outer periphery of a semiconductor single crystal thin film caused by an increased influence is too sharp, simple stoppage of supply of a dopant gas onto area in the vicinity of the outer periphery of the semiconductor single crystal thin film from a gas inlet port is hard to exert a sufficient effect to make a resistivity distribution along a diameter of the semiconductor single crystal thin film uniform. On the other hand, in a case where a high resistivity semiconductor single crystal substrate of a resistivity higher than 0.02 Ω·cm is used, since an influence of the auto-doping phenomenon decreases and reduction in resistivity in the vicinity of the outer periphery of a semiconductor single crystal thin film caused by the influence thereof becomes small, there arises no need for stoppage of supply of a dopant gas on to the area in the vicinity of the outer periphery from a gas inlet port, but depending on circumstances, stoppage of supply of a dopant gas onto the area in the vicinity of the outer periphery, to the contrary, has a risk to induce non-uniformity in resistivity distribution across all the semiconductor single crystal thin film. Therefore, in a case of a resistivity of a semiconductor single crystal substrate ranging from 0.1 Ω·cm to 0.02 Ω·cm, both limits being included, stoppage of supply of a dopant gas onto an area in the vicinity of the outer periphery of the substrate from a gas inlet port works most effectively to make a resistivity distribution along a diameter of a semiconductor thin film uniform.

Further, in a production method for a semiconductor wafer relating to the invention, it is preferable that a semiconductor single crystal substrate is a silicon single crystal substrate and a semiconductor thin film is a silicon single crystal thin film. That is, a large diameter and a uniform resistivity distribution of a silicon single crystal wafer that is currently a main stream of semiconductor wafers are both achieved and thereby, a wide application of the silicon single crystal wafer in various aspects are expected in fabrication of semiconductor devices.

EMBODIMENTS OF INVENTION

Description will be made of an embodiment of the invention below with reference to the accompanying drawings.

Figure 1:
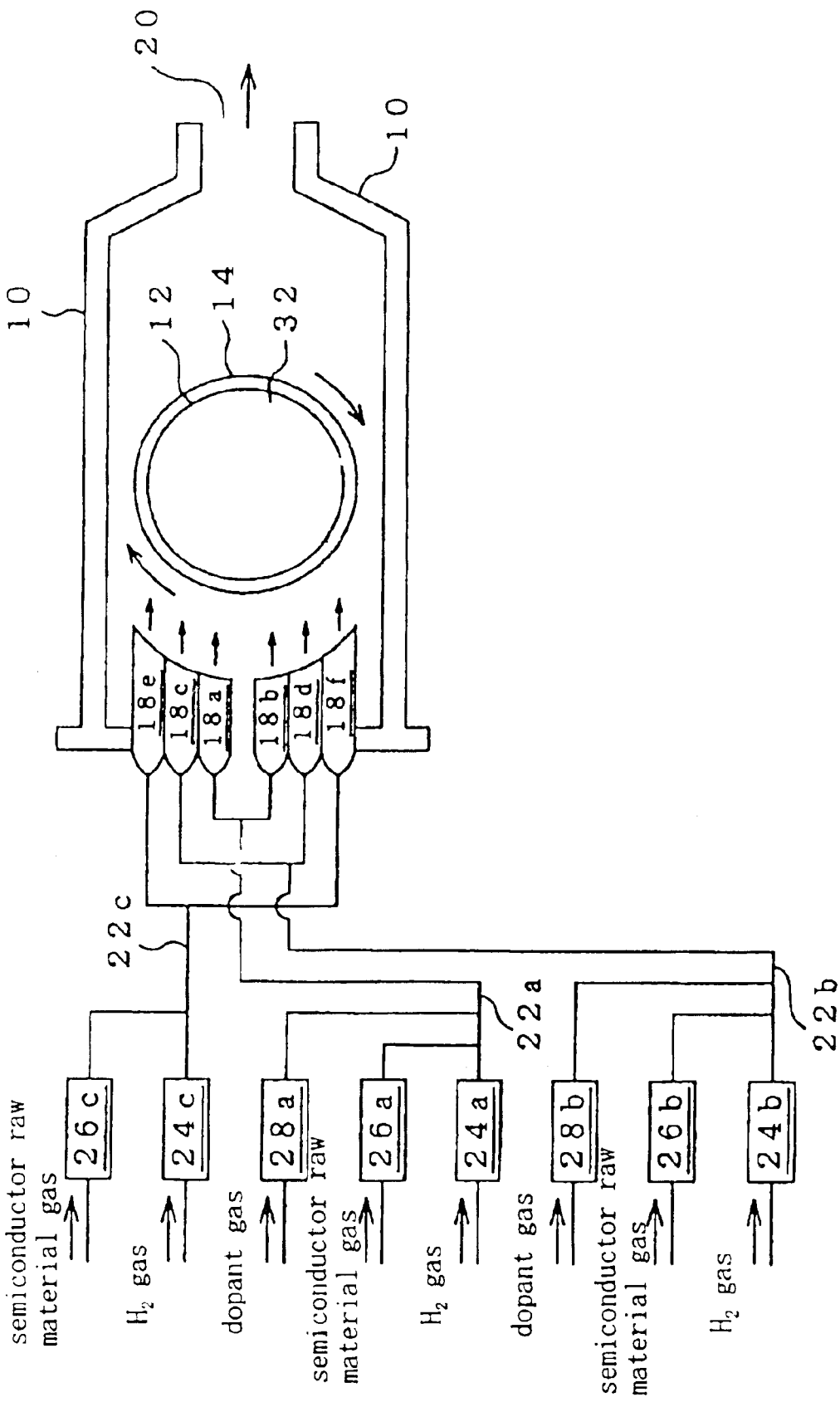
FIG. 1 is a sectional view in a horizontal plane showing a horizontal, single wafer vapor phase growth apparatus used in a production method for a semiconductor wafer in a simplified manner, relating to an embodiment of the invention.
Figure 5:
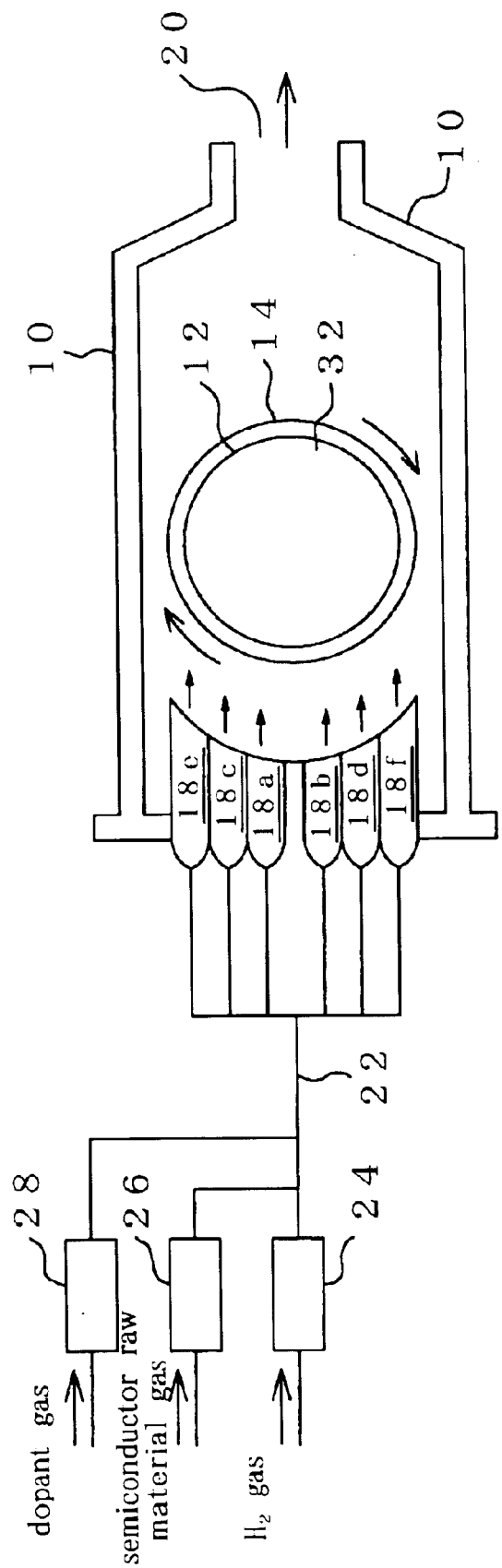
FIG. 5 is a sectional view in a horizontal plane showing a conventional horizontal, single wafer vapor phase growth apparatus used in a conventional production method for a semiconductor wafer in a simplified manner.
Figure 6:
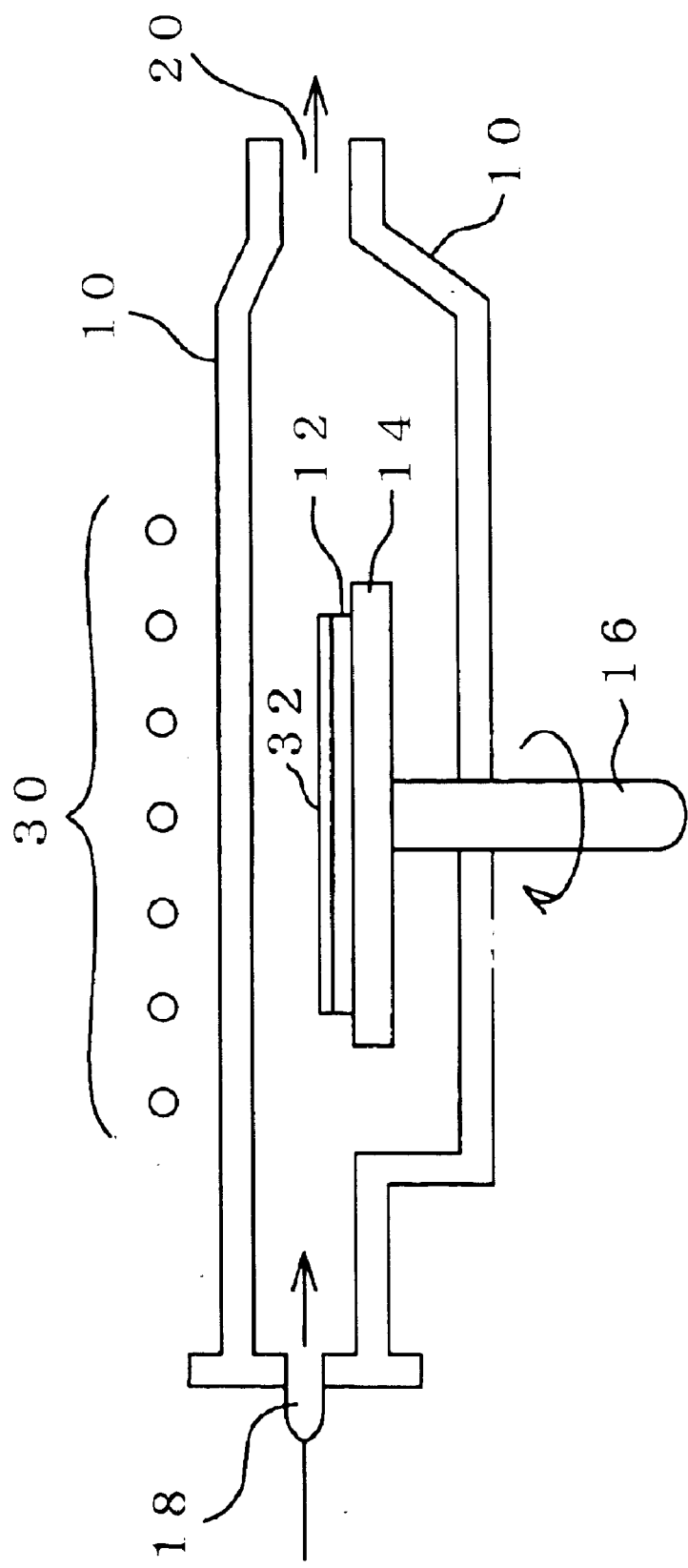
FIG. 6 is a sectional view in a vertical plane showing a conventional horizontal, single wafer vapor phase growth apparatus used in a production method for a semiconductor wafer in a simplified manner.

FIG. 1 is a sectional view in a horizontal plane showing a horizontal, single wafer vapor phase growth apparatus used in a production method for a semiconductor wafer in a simplified manner, relating to an embodiment of the invention. It should be noted that since a sectional view in a vertical plane showing the horizontal, single wafer vapor phase growth apparatus used in a production method for a semiconductor wafer in a simplified manner, relating to an embodiment of the invention is basically similar to FIG. 6, therefore FIG. 6 is used in description thereof and the sectional view in a vertical plane of the horizontal, single wafer vapor phase growth apparatus is not shown. Further, in FIG. 1, the same constituents as those of the conventional horizontal, single wafer vapor phase growth apparatus in FIGS. 5 and 6 are represented by the same marks as those corresponding in FIGS. 5 and 6 and descriptions thereof are omitted or simplified.

As shown in FIGS. 1 and 6, in a horizontal, single wafer vapor phase growth apparatus used in a production method for a semiconductor wafer, relating to this embodiment, a susceptor 14 on which a silicon single crystal substrate 12 is horizontally placed is disposed at the bottom of the middle portion of a transparent quartz glass reaction chamber 10 installed along a horizontal direction and the susceptor 14 is coupled with a rotation device (not shown) through a rotary shaft 16.

Further, a gas inlet port 18 is provided at one end in a length direction of the reaction chamber 10 and a gas outlet port 20 is provided at the other end thereof. With this construction, a flow of a gas which is introduced through the gas inlet port 18 and discharged through the gas outlet port 20 to the outside passes over a main surface of the silicon single crystal substrate 12 placed on the susceptor 14 along a length direction of the reaction chamber 10.

Further, the gas inlet port 18 of the reaction chamber 10 is constructed of six inlet ports 18a to 18f spread in a width direction of the reaction chamber 10. Among the six inlet ports 18a to 18f, inner inlet ports 18a and 18b, outer inlet ports 18e and 18f and middle inlet ports 18c and 18d are arranged in symmetry with respect to an imaginary central axis along the length direction of the reaction chamber 10 passing through the center of the main surface of the silicon single crystal substrate 12 on the susceptor 14.

To be more detailed, the inner inlet ports 18a and 18b are directed toward points in the vicinity of the center of the main surface of the silicon single crystal substrate 12 on an imaginary central axis along a width direction of the reaction chamber 10 passing through the center of the main surface of the silicon single crystal substrate 12 on the susceptor 14, and the outer inlet ports 18e and 18f are directed toward points in the vicinity of the outer periphery of the main surface of the silicon single crystal substrate 12 on the imaginary central axis line and the middle inlet ports 18c and 18d are directed toward points between the central portion and the outer peripheral portion of the main surface of the silicon single crystal substrate 12 on the imaginary central axis line.

Further, the inner inlet ports 18a and 18b are both connected to a common gas pipe 22a. The common gas pipe 22a are branched in three ways and the branches are connected to a gas source (not shown) of hydrogen ($H_2$) gas, a gas source (not shown) of a semiconductor raw material gas and a gas source (not shown) of a dopant gas through MFC 24a, 26a and 28a, respectively, as gas flow rate regulators.

Likewise, further, the middle inlet ports 18c and 18d are both connected to a common gas pipe 22b. The common gas pipe 22b are branched in three ways and the branches are connected to a gas source (not shown) of hydrogen ($H_2$) gas, a gas source (not shown) of a semiconductor raw material gas and a gas source (not shown) of a dopant gas through MFC 24b, 26b and 28b, respectively, as gas flow rate regulators.

Likewise, further, the outer inlet ports 18e and 18f are both connected to a common gas pipe 22c. The common gas pipe 22b are branched in two ways and the branches are connected to a gas source (not shown) of hydrogen ($H_2$) gas and a gas source (not shown) of a semiconductor raw material gas through MFC 24c and 26c, respectively, as gas flow rate regulators. However, the common gas pipe 22c connected to the outer inlet ports 18e and 18f is not connected to the gas source of a dopant gas and therefore, a MFC regulating a gas flow rate of the dopant gas is not connected to the common gas pipe 22c either.

It should be here noted that as a semiconductor raw material gas, there is employed, for example, Si-containing gas, such as $SiCl_4$ (tetrachlorosilane) gas, $SiH_2Cl_2$ (dichlorosilane) gas. $SiHCl_3$ (trichlorosilane) gas or $SiH_4$ (monosilane) gas, while as a dopant gas, there is employed, for example, $B_2H_6$ (diborane) gas, $PH_3$ (phosphine) gas or the like gases.

Further, outside of the reaction chamber 10, there is disposed an infrared radiation lamp 30, for example, as a heat source heating the silicon single crystal substrate 12 placed horizontally on the susceptor 14 to raise a temperature of the main surface of the silicon single crystal substrate 12 to a predetermined value. In addition, cooling means (not shown) for cooling the infrared radiation lamp 30 and an outer wall of the reaction chamber 10 is equipped.

Then, description will be made of a method for forming a silicon single crystal thin film on a main surface of a silicon single crystal substrate 12 using the horizontal, single wafer vapor phase growth apparatus shown in FIGS. 1 and 6.

First, a silicon single crystal substrate 12 is horizontally placed on the susceptor 14 in the reaction chamber 10. Following the placement of the silicon single crystal substrate 12 on the susceptor 14, $H_2$ gas is supplied into the reaction chamber 10 from a gas source of $H_2$ gas through MFC 24a, 24b and 24c, the common gas pipes 22a, 22b and 22c and the six inlet ports 18a to 18f to substitute for a previous atmosphere in the reaction chamber 10. Further, the susceptor 14 is clockwise rotated as shown by arrow marks in FIGS. 1 and 6 by the rotation unit through the rotary shaft 16 with the silicon single crystal substrate 12 being kept horizontally on the susceptor 14. With the infrared radiation lamp 30, heating is effected on the silicon single crystal substrate 12 on the susceptor 14 according to a predetermined temperature programme to raise a temperature at a main surface thereof to a predetermined set temperature.

Following the heating power adjustment, a main surface temperature of the silicon single crystal substrate 12 is controlled according to the predetermined temperature programme and in the vapor phase growth step, not only is a semiconductor raw material gas is supplied into the reaction chamber 10 from a gas source of the semiconductor raw material gas through MFC 26a, 26b and 26c, the common gas pipes 22a, 22b and 22c and the six inlet ports 18a to 18f, respectively, but a dopant gas is also supplied into the reaction chamber 10 from a gas source of the dopant gas through MFC 28a, 28b and 28c, the common gas pipes 22a and 22b and the four inlet ports 18a to 18d.

At this time, flow rates of $H_2$ gas as carrier gas, a semiconductor raw material gas and a dopant gas are separately controlled by MFC 24a, 24b and 24c, MFC 26a, 26b and 26c, and MFC 28a and 28b, respectively, to a precision. The $H_2$ gas, the semiconductor raw material gas and the dopant gas whose respective flow rates precisely controlled by MFC 24a, 26a and 28a are mixed to form a mixture and the mixture is introduced into the reaction chamber 10 as a process gas with almost no diffusion in a width direction of the reaction chamber 10 therein from the inner inlet ports 18a and 18b disposed in a width direction of the reaction chamber 10.

Likewise, further, the $H_2$ gas, the semiconductor raw material gas and the dopant gas whose respective flow rates precisely controlled by MFC 24b, 26b and 28b are mixed to form a mixture and the mixture is introduced into the reaction chamber 10 as a process gas with almost no diffusion in a width direction of the reaction chamber 10 therein from the middle inlet ports 18c and 18d disposed in a width direction of the reaction chamber 10.

Likewise, further, the $H_2$ gas and the semiconductor raw material gas whose respective flow rates precisely controlled by MFC 24c and 26c are mixed to form a mixture and the mixture is introduced into the reaction chamber 10 as a process gas with almost no diffusion in a width direction of the reaction chamber 10 therein from the outer inlet ports 18e and 18f disposed in a width direction of the reaction chamber 10. However, no dopant gas is introduced from the outer inlet ports 18e and 18f into the reaction chamber 10.

A process gas introduced in the reaction chamber 10 passes over the main surface of the silicon single crystal substrate 12 placed on a susceptor 14 rotating about a rotary shaft 16 as a center of rotation in one direction and in almost parallel to the main surface. At this time, while the $H_2$ gas as a carrier gas, the semiconductor raw material gas and the dopant gas supplied from the inner inlet ports 18a and 18b, and the middle inlet ports 18c and 18d pass over an area in the vicinity of the center of the main surface of the silicon single crystal substrate 12 and the intermediate area, on the other hand, $H_2$ gas as a carrier gas and the semiconductor raw material gas supplied from the outer inlet ports 18e and 18f pass over an area in the vicinity of the outer periphery of the main surface of the silicon single crystal substrate 12 without supply of the dopant gas from the outer inlet ports 18e and 18f. In such conditions, a chemical reaction occurs to grow a silicon single crystal thin film 32 in vapor phase on the main surface of the silicon single crystal substrate 12.

As described above, according to this embodiment, when a process gas is supplied onto a main surface of a semiconductor single crystal substrate 12 in rotation in one direction and in almost parallel to the main surface thereof from the six inlet ports 18a to 18f disposed in a width direction of the reaction 10, the $H_2$ gas as a carrier gas, the semiconductor raw material gas and the dopant gas are supplied onto the area in the vicinity of the center and the intermediate area of the silicon single crystal substrate 12 from the inner inlet ports 18a and 18b, and the middle inlet ports 18c and 18d, while only the $H_2$ gas and the semiconductor raw material gas are supplied onto the area in the vicinity of the outer periphery of the silicon single crystal substrate 12 from the outer inlet ports 18e and 18f with no supply of the dopant gas onto the area. In such conditions, a concentration of the dopant gas supplied onto the area in the vicinity of the outer periphery thereof becomes lower than that of the dopant gas supplied onto the other areas including the area in the vicinity of the center and the intermediate area on a relative basis. However, a dopant gas produced by the auto-doping phenomenon is supplied onto the area in the vicinity of the outer periphery of the silicon single crystal substrate 12. For this reason, the dopant gases supplied form the gas inlet ports 18 and produced and supplied by the auto-doping phenomenon are combined, a concentration of the dopant gas supplied across the whole of the main surface of the silicon single crystal substrate 12 is almost uniform. In other words, it is first considered that a dopant gas is produced by the auto-doping phenomenon and supplied onto an area in the vicinity of the outer periphery of a main surface of a silicon single crystal substrate 12, and then, supply of a dopant gas onto the area in the vicinity of the outer periphery of the main surface of a silicon single crystal substrate from the outer inlet ports 18e and 18f are ceased, thereby resulted in achievement of near uniformity in concentration of the dopant gas supplied across all the main surface. Therefore, a resistivity distribution along a diameter of a silicon single crystal thin film 32 grown in vapor phase on a main surface of a silicon single crystal substrate 12 can be made more uniform without providing an extra step of forming an auto-doping preventive film on a rear main surface of the silicon single crystal substrate 12.

Further, a supply rate of a dopant gas from the inner inlet ports 18a and 18b and a supply rate of the dopant gas from the middle inlet ports 18c and 18d are individually controlled with MFC 28a and 28b, respectively, and thereby, a concentration of the dopant gas supplied onto an area in the vicinity of the central portion of the main surface of the silicon single crystal substrate 12 and the intermediate area thereof other than an area in the vicinity of the outer periphery thereof can be adjusted to be more uniform with high accuracy, thereby enabling more uniform resistivity distribution along a diameter of a silicon single crystal thin film 32.

EXAMPLE

Description will be made, using FIGS. 2 and 3, of concrete operating conditions for formation of a silicon single crystal thin film on a main surface of silicon single crystal substrate using the horizontal, single wafer vapor phase growth apparatus shown in FIGS. 1 and 6 and a resistivity distribution of a silicon single crystal thin film 32 thus formed under the concrete operating conditions.

Figure 2:
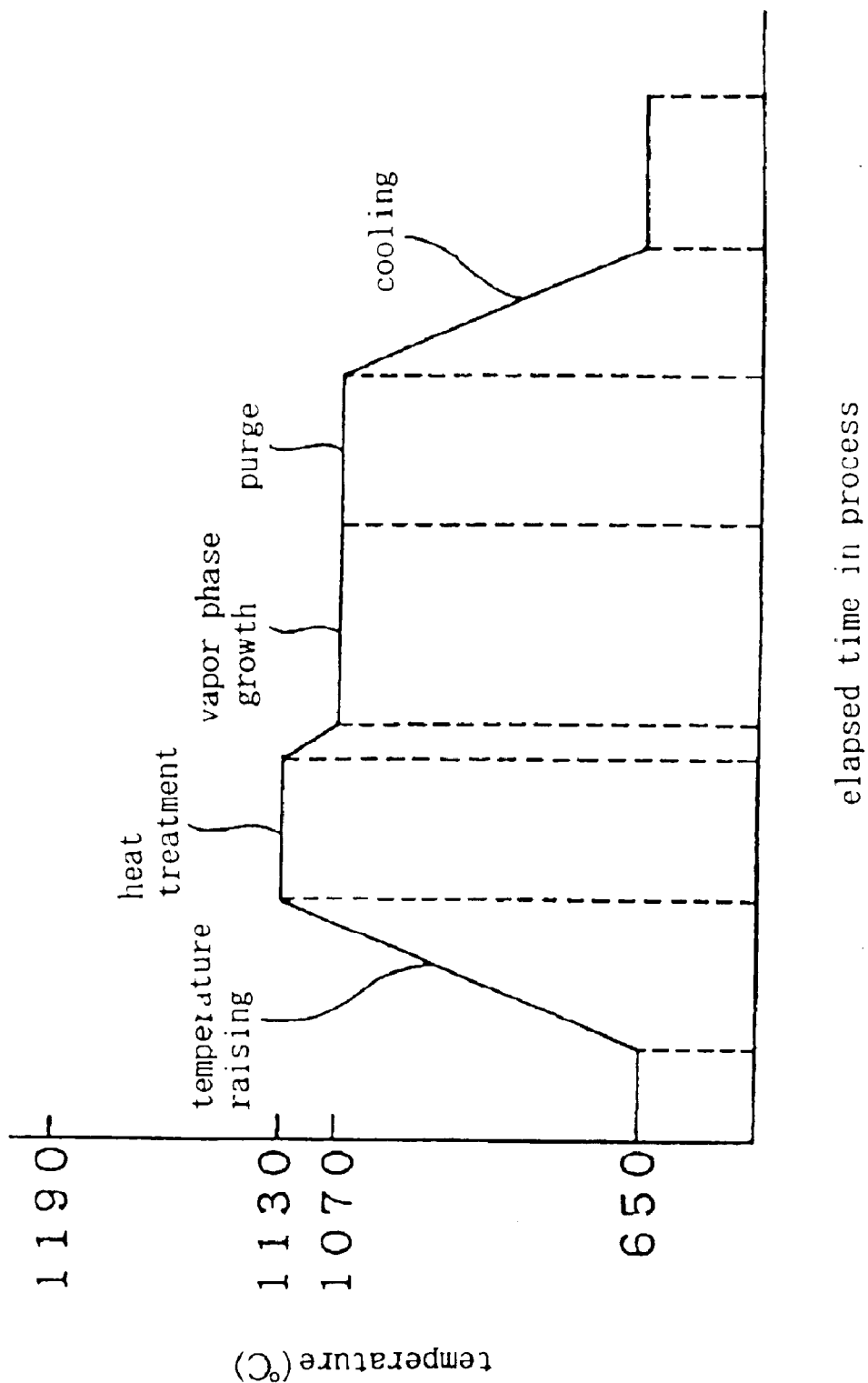
FIG. 2 is a graph showing a temperature programme in production of a semiconductor wafer using the vapor phase growth apparatus of FIG. 1.
Figure 3:
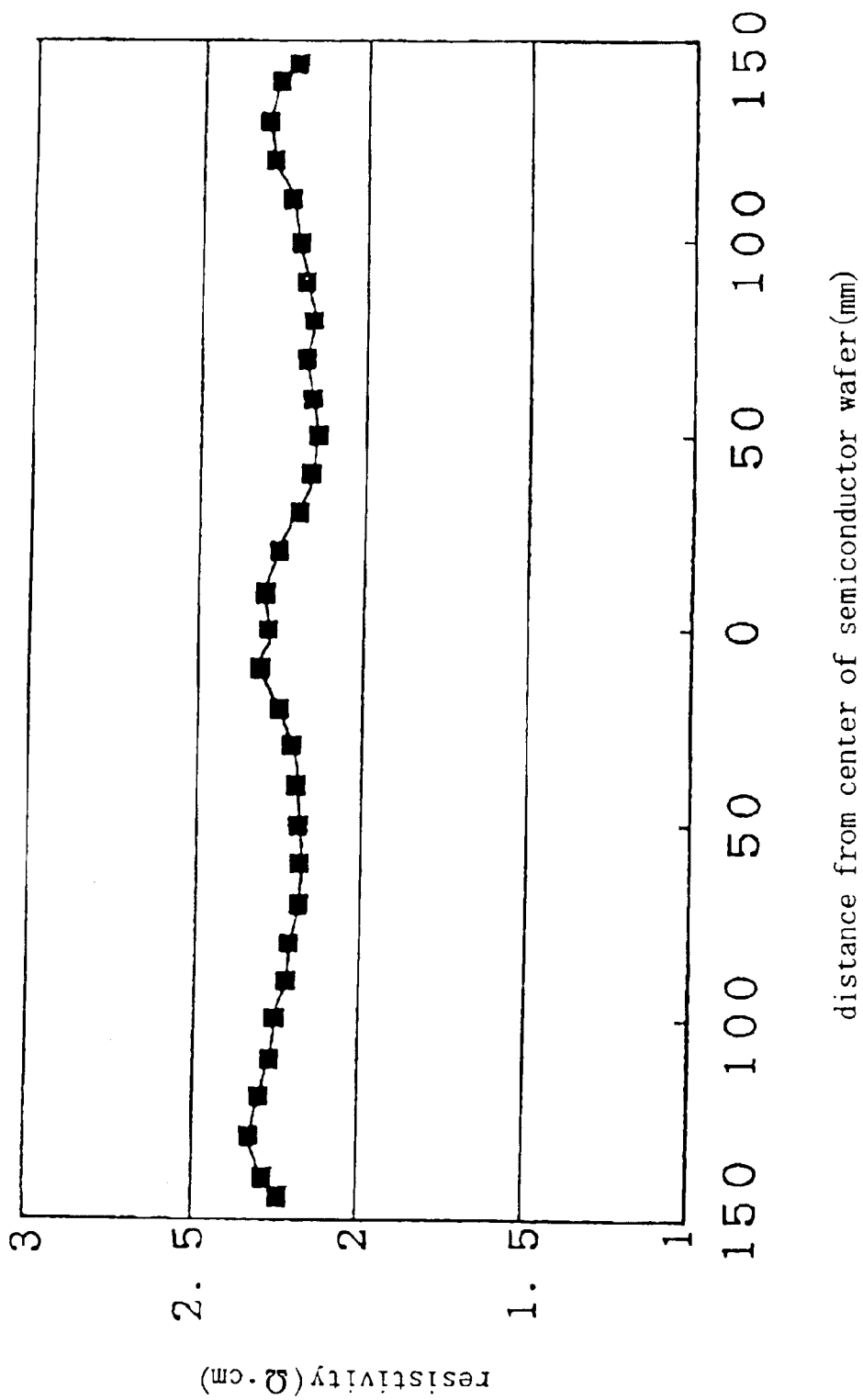
FIG. 3 is a graph showing a resistivity distribution along a diameter of a semiconductor wafer produced using the vapor phase growth apparatus of FIG. 1.

FIG. 2 is a graph showing a temperature programme in production of a semiconductor wafer using the vapor phase growth apparatus shown in FIG. 1 and FIG. 3 is a graph showing a resistivity distribution along a diameter of a semiconductor wafer produced using the vapor phase growth apparatus of FIG. 1.

As the silicon single crystal substrate 12 placed on the susceptor 14 in the reaction chamber 10, there is used a p-type low resistivity silicon single crystal substrate 12 of 300 mm±0.2 mm in diameter and of a resistivity in the range of from 0.01 $\Omega$·cm to 0.02 $\Omega$·cm, both limits being included, in which boron is doped at a high concentration.

After the silicon single crystal substrate 12 is horizontally placed on the susceptor 14 in the reaction chamber 14, $H_2$ gas is supplied into the reaction chamber 10 through the six inlet ports 18a to 18f to achieve a $H_2$ atmosphere in the reaction chamber 10. Further, the susceptor 14 is rotated by a rotation unit, for example, clockwise while keeping the silicon single crystal substrate 12 horizontally on the susceptor 14.

In the $H_2$ atmosphere, the infrared radiation lamp 30 as a heat source is supplied with electricity to heat the silicon single crystal substrate 12 on the susceptor 14 and raise a temperature of the main surface of the silicon single crystal substrate 12 to 1130° C. according to the temperature programme of FIG. 2 (a temperature raising step). Thereafter, the temperature is kept at 1130° C. for a time to perform a heat treatment for removing a natural oxide film formed on the main surface of the silicon single crystal substrate 12 (a heat-treatment step).

After the heat treatment, the temperature of the main surface of the silicon single crystal substrate 12 is lowered to 1070° C. from 1130° C. and subsequent to this change in temperature, the process gas composed of $H_2$ gas as a carrier gas, the semiconductor raw material gas and the dopant gas is supplied into the reaction chamber 10 through the six inlet ports 18a to 18f.

At this time, a flow rate of $H_2$ gas as a carrier gas is precisely controlled individually with MFC 24a, 24b and 24c at 70 l/min in total and supplied into the reaction chamber 10 through all of the inlet ports 18a to 18f in a uniform manner. Further, as a semiconductor raw material gas, for example, a mixed gas obtained by bubbling hydrogen in liquid $SiHCl_3$ is used and this mixed gas supplied from a common semiconductor raw material source is precisely controlled individually with MFC 26a, 26b and 26c at a flow rate of 22 l/min in total and supplied into the reaction chamber 10 through all of the inlet ports 18a to 18f in a uniform manner. Further, as a dopant gas, for example, $B_2H_6$ gas diluted with hydrogen is used and not only is the gas from a common dopant gas source is precisely controlled individually with MFC 28a and 28b, and supplied into the reaction chamber 10 through all of the inner inlet ports 18a and 18b at 50 $cm^3$/min, respectively, but the gas from a common dopant gas source is supplied into the reaction chamber 10 through the middle inlet ports 18c and 18d at a flow rate of 300 $cm^3$/min, respectively. No $B_2H_6$ gas is naturally supplied through the outer inlet ports 18e and 18f.

Further, the six inlet ports 18a to 18f disposed in a width direction of the reaction chamber 10 has a half width of 180 mm. The inlet ports in the half width are configured such that a width between the inner side of one of the inner inlet ports 18a and 18b and the outer side of the corresponding one of the middle inlet ports 18c and 18d is about 110 mm. For this reason, a process gas including a dopant gas supplied from the inner inlet ports 18a and 18b, and the middle inlet ports 18c and 18d pass over the area in the vicinity of the center and the intermediate area of a front main surface of a silicon single crystal substrate 12 other than a doughnut-like area of about 40 mm in width in the vicinity of the outer periphery thereof. Further, a process gas including no doping gas supplied through the outer inlet ports 18e and 18f pass over the doughnut-like area of about 40 mm in width in the vicinity of the outer periphery of a silicon single crystal substrate 12.

In such a manner, a chemical reaction occurs in the process gas supplied into the reaction chamber 10 and a p-type silicon single crystal thin film 32 with a target resistivity values of 2.2 Ω·cm and a target resistivity distribution of 8% or less (in a case of calculation with the above described formula (1)) or within ±4% less (in a case of calculation with the above described formula (2)) is grown on a main surface of a silicon single crystal substrate 12 in vapor phase to a thickness of 4 μm (a vapor phase growth step).

After the vapor phase growth, the inside of the reaction chamber 10 is sufficiently purged with $H_2$ gas (a purge step). Then, power supply to the infrared radiation lamp 30 as a heat source is cut and the semiconductor wafer obtained by forming the semiconductor single crystal thin film 32 on the main surface of the silicon single crystal substrate 12 is cooled down to 650° C. (a cooling step). Thereafter, the semiconductor wafer is taken out from the reaction chamber 10.

Then, the silicon single crystal thin film 32 thus formed on the main surface of the silicon single crystal substrate 12 is measured on a resistivity thereof.

A SCP (Surface Charge Profiler) device of a QC Solutions CO. located at Woburn, Mass., USA was employed in measurement of the resistivity. This SCP device adopts a SPV (surface photo voltage) method as a measurement principle described below. That is, first, a sample wafer is heated at about 300° C. for a short time such that an electric charge in a natural oxide film formed on a surface of the sample wafer becomes constant and the sample wafer surface is then illuminated with light of 450 nm in a wavelength emitted from a GaN (Gallium nitride) LED (Light Emitting Diode) in pulses of about 40 Hz in frequency.

Minority carriers excited by the incident light at a penetration depth of about 0.4 μm causes a change in potential at the sample wafer surface and this potential change is sensed as an SPV signal. Since the SPV signal is proportional to a width of a depletion layer and the width is in turn proportional to an impurity concentration in the silicon of the sample wafer, an impurity concentration at a depth of about 1 μm from the sample wafer surface is sensed and the sensed value is converted into a resistivity value.

With the SCP device, a resistivity distribution along a diameter of a silicon single crystal thin film 32 formed on a main surface of a silicon single crystal substrate 12 was measured at spatial intervals of 10 mm along a diameter and a result as shown in a graph of FIG. 3 was obtained.

COMPARATIVE EXAMPLE

Then, in order to conduct comparison with the result of the example, description will be made of a resistivity distribution of a silicon single crystal thin film formed on a main surface of a silicon single crystal substrate using a conventional horizontal, single wafer vapor phase growth apparatus with reference to FIG. 4.

Figure 4:
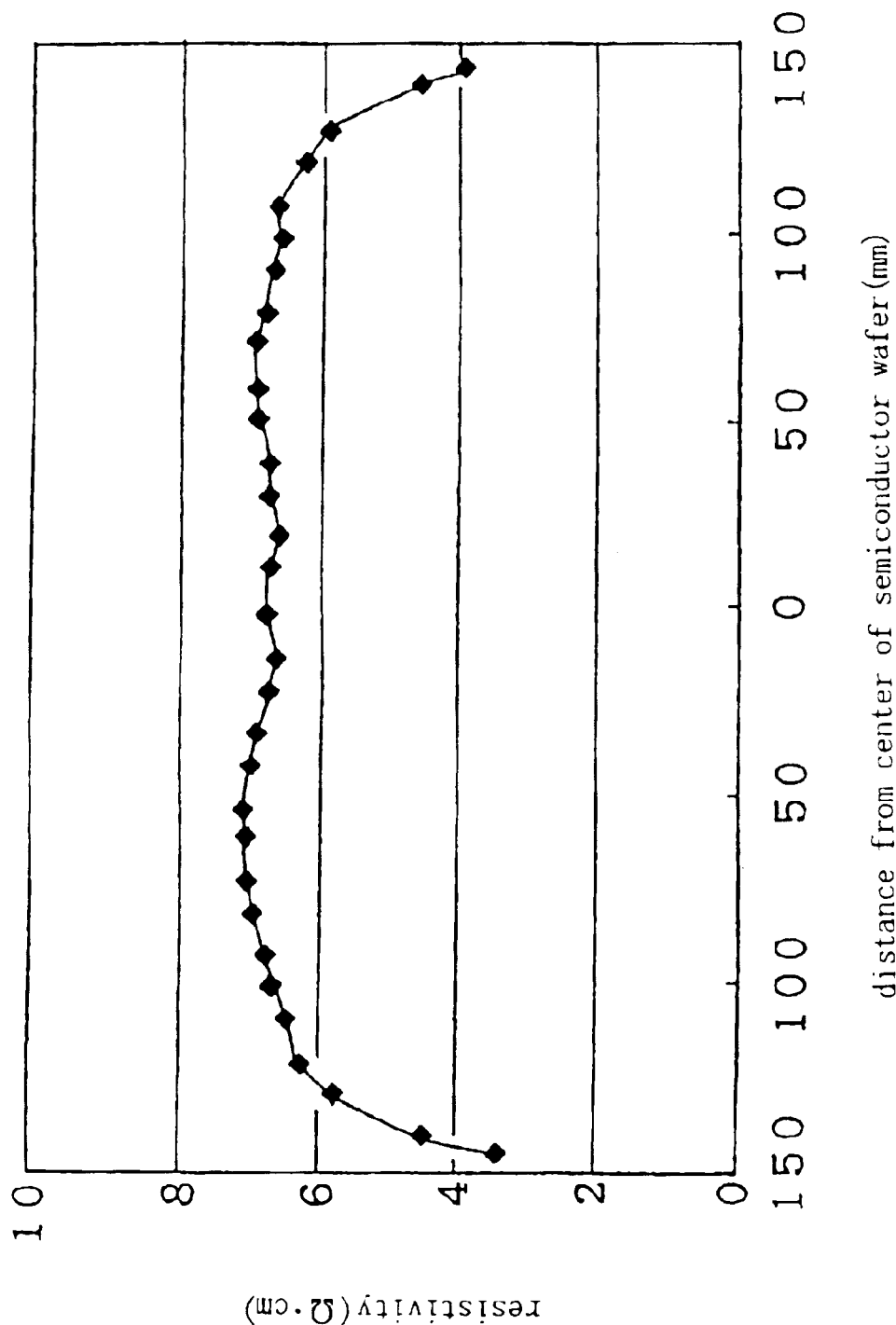
FIG. 4 is a graph showing a resistivity distribution along a diameter of a semiconductor wafer produced using a conventional vapor phase growth apparatus.

FIG. 4 is a graph showing a resistivity distribution along a diameter of a semiconductor wafer produced using a conventional vapor phase growth apparatus shown in FIG. 5.

In the comparative example, $B_2H_6$ gas diluted with hydrogen is used as a dopant gas and the $B_2H_6$ gas diluted with hydrogen is supplied into the reaction chamber 10 at a flow rate of 200 $cm^3$/min through each of all the inlet ports 18a to 18f in a uniform manner and vapor phase growth is effected at a temperature of 1100° C. The other conditions are the same as those of the above described example, such as a size, a resistivity of a silicon single crystal substrate 12 in use, kinds and flow rates of a carrier gas and a semiconductor raw material gas, conditions of a temperature programme Including a temperature raising step, a heat treatment step, a vapor phase growth step, a purge step and cooling step, and resistivity measurement conditions for a silicon single crystal thin film 32.

A silicon single crystal thin film 32 was formed on a main surface of a silicon single crystal substrate 12 using a conventional vapor phase growth apparatus in the above described conditions and a resistivity distribution of the silicon single crystal thin film 32 was measured at spatial intervals of 10 mm along a diameter and a result as shown in a graph of FIG. 4 was obtained. Then, comparison is conducted on the results shown in the graphs of FIG. 3 of the example and of FIG. 4 of the comparative example with each other.

First, when comparing the graphs of FIGS. 3 and 4 directly with each other, it is clear that, although reduction in resistivity was observed in the vicinity of each of the outer peripheries of silicon single crystal thin films 32 in both cases, a reduction in resistivity in the example was sufficiently smaller than that in the comparative example.

The reason is that since $B_2H_6$ gas was supplied at a flow rate of 200 $cm^3$/min through the outer inlet ports 18e and 18f onto an area in the vicinity of the outer periphery of the silicon single crystal thin film 32 in the comparative example and in addition to this, a dopant released by the auto-doping phenomenon from the rear main surface of the low resistivity silicon single crystal substrate 12 added with B at a high concentration was additionally supplied onto the area in the vicinity of the outer periphery thereof 32, therefore reduction in resistivity in the vicinity of the outer periphery of the silicon single crystal thin film 32 became extremely large in ratio, while since in the example, only a dopant generated by the auto-doping phenomenon is incorporated into the area in the vicinity of the outer periphery of the silicon single crystal thin film 32 and no $B_2H_6$ gas was from the outer inlet ports 18e and 18f is supplied, reduction in resistivity in the vicinity of the outer periphery of the silicon single crystal thin film 32 is, if any, small on a relative basis.

Further, between the graphs of FIGS. 3 and 4, comparison in terms of a numerical value goes as follows: that is, in the above example, as shown in FIG. 3, an average resistivity value over all measurement points of the silicon single crystal thin film 32 is 2.23 Ω·cm, which is very close to a target resistivity value of 2.2 Ω·cm. Further, when calculating a resistivity distribution of the silicon single crystal thin film 32 using the above described formula (1), the maximum resistivity is 2.32 Ω·cm and the minimum resistivity is 2.15 Ω·cm, thereby resulting in a resistivity distribution of 7.7%, and satisfying a target value of a resistivity distribution of 8% or less. Further, when calculating a resistivity distribution of the silicon single crystal thin film 32 using the above described formula (2), a resistivity distribution is ±3.8%, which satisfies a target value of a resistivity distribution of ±4.0% or less.

On the other hand, in the comparative example, as shown in FIG. 4, an average resistivity over all measurement points of the silicon single crystal thin film 32 is 6.39 Ω·cm. Further, a resistivity distribution in the silicon single crystal thin film 32 is 57.9% (in a case of calculation with the above described formula (1)) or ±35.0% (in a case of calculation with the above described formula (2)), which exceeds the target value of 8% or ±4.0% in great excess.

As described above, from the comparison of the example and the comparative example with each other, it was recognized that even when a silicon single crystal thin film 32 was grown in vapor phase on a main surface of a silicon single crystal substrate 12 as large as 300 mm±0.2 mm in diameter, uniformity of a resistivity distribution along a diameter of the silicon single crystal thin film 32 was able to be sufficiently improved compared with a conventional practice.

It should be noted that it was cleared that when the inventor repeated experiments changing various conditions including ones other than the conditions in consideration in the above described example, resistivity distributions of silicon single crystal thin films 32 fluctuated more or less according to concentrations of a semiconductor raw material gas and a dopant gas supplied into the reaction chamber 10 and a reaction temperature. However, when a production method for a semiconductor wafer relating to the above described embodiment was applied and a silicon single crystal thin film 32 was grown in vapor phase on a main surface of a low resistivity silicon single crystal substrate 12 of 300 mm in diameter, then a resistivity distribution of the silicon single crystal thin film 32 was be able to be easily controlled within 8% or less, both limits being included, (in the case of the above described formula (1)) or ±4.0% or less (in the case of the above described formula (2)).

Even when a diameter of a silicon single crystal substrate 12 ranged from 300 mm to 400 mm, both limits being included, similar to the above, a resistivity distribution of a silicon single crystal thin film 32 grown in vapor phase on a main surface of the silicon single crystal substrate 12 was able to be easily controlled to be 8% or less (in the case of the above described formula (1)) or within ±4.0% or less (in the case of the above described formula (2)). To be described further, while in a case where a diameter of a silicon single crystal substrate 12 exceeds 400 mm, the silicon single crystal substrate 12 with sufficiently high quality is hard to be manufactured in a stable manner at the present stage, uniformity in a resistivity distribution along a diameter direction of a silicon single crystal thin film 32 formed on a main surface of the silicon single crystal substrate 12 can be improved.

However, as a resistivity of a silicon single crystal substrate 12 becomes higher in a range beyond 0.02 Ω·cm, an influence of the auto-doping phenomenon decreases and therefore, reduction in resistivity in the vicinity of the outer purify of a silicon single crystal thin film 32 decreases, which produced a case where there arose a need to supply a dopant gas through the outer inlet ports 18e and 18f in order to attain a uniform resistivity distribution across all the silicon single crystal thin film 32.

Further, when a resistivity of a silicon single crystal substrate 12 is lower than 0.01 Ω·cm, an influence of the auto-doping phenomenon increases and therefore, even when supply of a dopant gas from the outer inlet ports 18e and 18f ceased to prevent reduction in resistivity in the vicinity of the outer periphery of a silicon single crystal thin film 32 from occurring, it became hard for a resistivity distribution of the silicon single crystal thin film 32 to be suppressed to be 8% or less (in a case of calculation with the above described formula (1)) or within ±4% or less (in a case of calculation with the above described formula (2)). Therefore, an auto-doping preventive film was necessary to be formed on the rear main surface of the silicon single crystal substrate 12.

INDUSTRIAL APPLICABILITY

As described above, according to a semiconductor wafer and a production method therefor, relating to the invention, the following effects can be exerted.

That is, a semiconductor wafer relating to the invention has a construction in which a semiconductor single crystal substrate as large as in the range of from 300 mm to 400 mm in diameter, both limits being included, and of a resistivity ranging from 0.01 Ω·cm to 0.02 Ω·cm, both limits being included, is used to form a semiconductor thin film of a resistivity distribution along a diameter of 8% or less (in a case of calculation with the above described formula 1)) or within ±4% or less (in a case of calculation with the above described formula (2)) on a main surface of the semiconductor single crystal substrate. Since with a semiconductor wafer relating to the invention, a large diameter and uniform resistivity which semiconductor wafers used in recent years require are simultaneously achieved, the semiconductor wafer greatly contributes to improvement on increase in throughput and yield in fabrication of semiconductor chips.

Further, according to a semiconductor wafer relating to the invention, the semiconductor wafer has a construction in which a semiconductor thin film of a resistivity distribution along a diameter of 8% or less (in a case of calculation with the above described formula (1)) or within ±4% or less (in a case of calculation with the above described formula (2)) is formed on a main surface of the semiconductor single crystal substrate as large as in the range of from 300 mm to 400 mm in diameter, both limits being included, of a resistivity ranging from 0.01 Ω·cm to 0.02 Ω·cm, both limits being included, and thereby, a large diameter and uniform resistivity which semiconductor wafers used in recent years requires are simultaneously achieved, so that the semiconductor wafer greatly contributes to improvement on increase in throughput and yield in fabrication of semiconductor chips.

In a production method for a semiconductor wafer relating to the invention, when a semiconductor raw material gas is supplied through a plurality of gas inlet ports disposed in a width direction of a reaction chamber onto a main surface of a semiconductor single crystal substrate in the reaction chamber in one direction in almost parallel to the main surface thereof, a dopant gas is supplied from gas inlet ports in the inner side among the plurality of gas inlet ports, that is, without supplying the dopant gas from gas inlet ports in the outer side among the plurality of gas inlet ports. Thereby, a dopant gas supplied through gas inlet ports and an additional dopant gas supplied by the auto-doping phenomenon are combined and a concentration of the combined dopant gas supplied to across all the main surface of the semiconductor substrate is almost uniform. Therefore, a resistivity distribution along a diameter of the semiconductor thin film grown in vapor phase on the main surface of the semiconductor single crystal substrate is enabled to be more uniform with no need to provide an extra step of forming an auto-doping protective film on the rear main surface of the semiconductor single crystal substrate.

Further, according to a production method for a semiconductor wafer relating to the invention, the plurality of gas inlet ports include the three kinds of the inner gas inlet port, the outer gas inlet port and the middle gas inlet port and, on an imaginary central axis along a width direction of the reaction chamber, passing through the center of the main surface of the semiconductor single crystal substrate, a semiconductor raw material gas is supplied onto an area in the vicinity of the center of the main surface of the semiconductor single crystal substrate from the inner gas inlet port, onto an area in the vicinity of the outer periphery thereof from the outer gas inlet port and onto an intermediate area between the area in the vicinity of the center and the area in the vicinity of the outer periphery from the middle gas inlet port, while a dopant gas is not supplied from the outer gas inlet port but from the inner and middle gas inlet ports. In this situation, since a dopant gas supplied onto the area in the vicinity of the center of the main surface of the semiconductor single crystal substrate and the intermediate area thereof, and a dopant gas supplied onto the area in the vicinity of the outer periphery of the main surface thereof by the auto-doping phenomenon can be combined to make a concentration of the combined dopant gas supplied to over all the main surface thereof almost uniform, therefore, a resistivity distribution along a diameter of the semiconductor thin film grown in vapor phase on the main surface of the semiconductor single crystal substrate is enabled to be more uniform with no need to provide an extra step of forming an auto-doping protective film on the rear main surface of the semiconductor single crystal substrate.

Further, according to a production method for a semiconductor wafer relating to the invention, on an imaginary central axis along a width direction of a reaction chamber, passing through the center of a main surface of a semiconductor single crystal substrate, amounts of a dopant gas supplied onto an area in the vicinity of the center and the intermediate area, of the main surface of a semiconductor single crystal substrate other than an area in the vicinity of the outer periphery thereof are individually controlled and thereby, concentrations of the dopant gas supplied onto the central portion and the intermediate area can be uniform, so that uniformity of resistivity distribution along a diameter of a semiconductor thin film grown in vapor phase on the main surface of a semiconductor single crystal substrate can be further improved.

It should be noted that while sharp reduction in resistivity in the vicinity of the outer periphery of a semiconductor single crystal thin film occurs conspicuously in a case of a semiconductor single crystal substrate as large as 300 mm or more in diameter and further, excessively sharp reduction in resistivity in the vicinity of the outer periphery of a semiconductor single crystal thin film is caused in a case of semiconductor a single crystal substrate as low as 0.01 Ω·cm or less in resistivity by the auto-doping phenomenon, on the other hand, reduction in resistivity in the vicinity of the outer periphery of a semiconductor single crystal substrate caused by the auto-doping phenomenon is small in a case of a semiconductor single crystal substrate as high as 0.02 Ω·cm or more in resistivity. Hence, the above described effects can be sufficiently exerted in a case where a semiconductor single crystal substrate a diameter of 300 mm or more and a resistivity ranging from 0.1 Ω·cm to 0.02 Ω·cm, both limits being included is used.

What is claimed is:

1. A production method for a semiconductor wafer in which a semiconductor raw material gas is supplied to over a main surface of a semiconductor single crystal substrate in rotation in a reaction chamber in one direction in almost parallel to the main surface thereof from a plurality of gas inlet ports disposed in a width direction of the reaction chamber to grow a semiconductor thin film on the main surface of the semiconductor single crystal substrate, characterized by that a dopant gas is supplied through gas inlet ports in an inner side among the plurality of gas inlet ports, wherein the plurality of gas inlet sorts are composed of three kinds including an inner inlet port disposed at an innermost side of a reaction chamber in a width direction thereof, an outer inlet port disposed at an outermost side thereof in the width direction and a middle inlet port disposed between the inner inlet port and the outer inlet port and gas inlet ports disposed in an inner side among the plurality of gas inlet ports include the inner inlet port and the middle inlet port, and wherein amounts of a dopant gas supplied from the inner inlet port and the middle inlet port are individually controlled.

2. A production method for a semiconductor wafer in which a semiconductor raw material gas is supplied to over a main surface of a semiconductor single crystal substrate in rotation in a reaction chamber in one direction in almost parallel to the main surface thereof from a plurality of gas inlet sorts disposed in a width direction of the reaction chamber to grow a semiconductor thin film on the main surface of the semiconductor single crystal substrate, characterized by that a dopant gas is supplied through gas inlet ports in an inner side among the plurality of gas inlet ports, and wherein the semiconductor single crystal substrate is a p-type semiconductor single crystal substrate of a diameter ranging from 300 mm to 400 mm, both limits being included, and a resistivity ranging from 0.01 Ω·cm to 0.02 Ω·cm, both limits being included.

3. A production method for a semiconductor wafer according to claim 2, wherein a diameter of the semiconductor single crystal substrate is 300 mm.

4. A production method for a semiconductor wafer according to claim 3, wherein the semiconductor crystal substrate is a silicon single crystal substrate, and the semiconductor thin film is a silicon single crystal thin film.

5. A production method for a semiconductor wafer according to claim 2, wherein the semiconductor crystal substrate is a silicon single crystal substrate, and the semiconductor thin film is a silicon single crystal thin film.

* * * * *

UNITED STATES PATENT AND TRADEMARK OFFICE
CERTIFICATE OF CORRECTION

PATENT NO. : 6,746,941 B2
DATED : June 8, 2004
INVENTOR(S) : Hiroki Ose

It is certified that error appears in the above-identified patent and that said Letters Patent is hereby corrected as shown below:

Column 18,
Lines 39 and 57, delete the word "sorts" and substitute therefore -- ports --.

Column 19,
Line 5, after "semiconductor" insert -- single --.

Column 20,
Line 2, after "semiconductor" insert -- single --.

Signed and Sealed this

Thirtieth Day of November, 2004

JON W. DUDAS
*Director of the United States Patent and Trademark Office*